(12) United States Patent
Strange et al.

(10) Patent No.: US 8,878,607 B2
(45) Date of Patent: Nov. 4, 2014

(54) INTEGRATED CIRCUIT, WIRELESS COMMUNICATION UNIT AND METHOD FOR A DIFFERENTIAL INTERFACE FOR AN ENVELOPE TRACKING SIGNAL

(71) Applicant: MediaTek Singapore Pte. Ltd., Singapore (SG)

(72) Inventors: Jonathan Richard Strange, Reigate (GB); Paul Fowers, Kent (GB)

(73) Assignee: MediaTek Singapore Pte. Ltd., Singapore (SG)

(*) Notice: Subject to any disclaimer, the term of this patent is extended or adjusted under 35 U.S.C. 154(b) by 0 days.

(21) Appl. No.: 14/151,847

(22) Filed: Jan. 10, 2014

(65) Prior Publication Data

US 2014/0111362 A1 Apr. 24, 2014

Related U.S. Application Data

(63) Continuation of application No. 13/612,888, filed on Sep. 13, 2012, now Pat. No. 8,665,018, and a continuation-in-part of application No. 13/345,760, filed on Jan. 9, 2012.

(60) Provisional application No. 61/549,491, filed on Oct. 20, 2011, provisional application No. 61/438,347, filed on Feb. 1, 2011, provisional application No. 61/563,316, filed on Nov. 23, 2011.

(51) Int. Cl.
*H03G 3/20* (2006.01)

(52) U.S. Cl.
USPC .............. 330/136; 330/10; 330/127; 330/297

(58) Field of Classification Search
USPC .................................... 330/136, 10, 127, 297
IPC ........................................................ H03G 3/20
See application file for complete search history.

(56) References Cited

U.S. PATENT DOCUMENTS 5,764,103 A * 6/1998 Burra et al. ..................... 330/51
6,194,941 B1 * 2/2001 Zarabadi et al. .............. 327/307

(Continued)

FOREIGN PATENT DOCUMENTS

CN 1361938 A 7/2002
CN 1443395 A 9/2003

(Continued)

OTHER PUBLICATIONS

"International Search Report" mailed on May 25, 2012 for International application No. PCT/EP2012/000341, International filing date:Jan. 25, 2012.

(Continued)

*Primary Examiner* — Patricia Nguyen
(74) *Attorney, Agent, or Firm* — Winston Hsu; Scott Margo

(57) ABSTRACT

A signal processing circuit has a first circuit, a digital-to-analog converter (DAC) and a second circuit. The first circuit receives a digital input signal with a non-zero direct current (DC) component, and subtracts at least a portion of the DC component of the received digital input signal from the received digital input signal. The DAC is operably coupled to the first circuit, and arranged to perform a digital-to-analog conversion upon an output of the first circuit. The second circuit is operably coupled to the DAC, and arranged to add a DC component to an analog output signal derived from an output of the DAC. The signal processing circuit may be part of an integrated circuit or a wireless communication unit.

20 Claims, 6 Drawing Sheets

(56) References Cited

U.S. PATENT DOCUMENTS

| | | | |
|---|---|---|---|
| 6,316,992 B1* | 11/2001 | Miao et al. | 330/2 |
| 6,321,073 B1* | 11/2001 | Luz et al. | 455/239.1 |
| 6,583,664 B2 | 6/2003 | Mathe | |
| 6,590,940 B1 | 7/2003 | Camp, Jr. | |
| 6,661,210 B2 | 12/2003 | Kimball | |
| 6,825,726 B2 | 11/2004 | French | |
| 6,934,341 B2* | 8/2005 | Sahlman | 375/297 |
| 6,937,847 B2 | 8/2005 | Ehrenreich | |
| 6,984,969 B1 | 1/2006 | Liu | |
| 7,058,373 B2 | 6/2006 | Grigore | |
| 7,228,109 B2* | 6/2007 | Paulus et al. | 455/74 |
| 7,421,037 B2 | 9/2008 | Shakeshaft | |
| 7,454,238 B2 | 11/2008 | Vinayak | |
| 7,474,149 B2 | 1/2009 | Snelgrove | |
| 7,482,869 B2 | 1/2009 | Wilson | |
| 7,653,366 B2 | 1/2010 | Grigore | |
| 7,932,780 B2 | 4/2011 | Elia | |
| 2005/0046474 A1 | 3/2005 | Matsumoto | |
| 2005/0064830 A1 | 3/2005 | Grigore | |
| 2005/0122163 A1 | 6/2005 | Chu | |
| 2010/0250993 A1 | 9/2010 | Drogi | |
| 2011/0279180 A1 | 11/2011 | Yamanouchi | |
| 2012/0200435 A1 | 8/2012 | Ngo | |
| 2012/0206201 A1 | 8/2012 | Mizokami | |
| 2013/0200949 A1* | 8/2013 | Wilson | 330/127 |
| 2014/0065979 A1* | 3/2014 | Terry | 455/73 |

FOREIGN PATENT DOCUMENTS

| | | |
|---|---|---|
| CN | 1879070 A | 12/2006 |
| CN | 101233681 A | 7/2008 |
| CN | 101527545 A | 9/2009 |
| EP | 1 492 227 A1 | 12/2004 |
| JP | H0553317 U | 7/1993 |
| JP | 200520696 A | 1/2005 |
| JP | 2005102146 A | 4/2005 |
| JP | 2007181176 A | 7/2007 |
| JP | 2007215158 A | 8/2007 |
| JP | 2010166157 A | 7/2010 |
| WO | 2006082894 A1 | 8/2006 |
| WO | 2010073941 A1 | 7/2010 |

OTHER PUBLICATIONS

ERTL, Basic Considerations and Topologies of Switched-Mode Assisted Linear Power Amplifiers, 1996 IEEE, pp. 207-213.

Van Der Zee, A Power Efficient Audio Amplifier Combining Switching and Linear Techniques, 1998 IEEE, pp. 288-291.

Yundt, Series- or Parallel-Connected Composite Amplifiers, IEEE Transactions on Power Electronics, pp. 48-54, vol. PE-1, No. 1, Jan. 1986.

\* cited by examiner

INTEGRATED CIRCUIT, WIRELESS COMMUNICATION UNIT AND METHOD FOR A DIFFERENTIAL INTERFACE FOR AN ENVELOPE TRACKING SIGNAL

CROSS REFERENCE TO RELATED APPLICATIONS

This is a continuation of co-pending U.S. application Ser. No. 13/612,888 (filed on Sep. 13, 2012), where the co-pending U.S. application Ser. No. 13/612,888 is a continuation-in-part (CIP) application of U.S. application Ser. No. 13/345,760 (filed on Jan. 9, 2012), which claims the benefit of U.S. provisional application No. 61/438,347 (filed on Feb. 1, 2011) and U.S. provisional application No. 61/563,316 (filed on Nov. 23, 2011), and this CIP application further claims the benefit of U.S. provisional application No. 61/549,491 (filed on Oct. 20, 2011). The entire contents of these related applications are incorporated herein by reference.

BACKGROUND OF THE INVENTION

The field of this invention relates to wireless communication units, integrated circuits, transmitter architectures and in particular circuits for providing a differential to single ended conversion of signals. The invention is applicable to, but not limited to, envelope tracking using a differential circuit configuration and a method therefor.

A primary application of the present invention is in the field of radio frequency (RF) power amplifiers capable of use in wireless telecommunication applications. Continuing pressure on the limited spectrum available for radio communication systems is forcing the development of spectrally-efficient linear modulation schemes. Since the envelopes of these linear modulation schemes fluctuate, this phenomenon results in the average power delivered to the antenna being significantly lower than the maximum power, potentially leading to poor efficiency of the power amplifier. Specifically, in this field, there has been a significant amount of research effort in developing high efficiency topologies capable of providing high performances in the 'back-off' (linear) region of the power amplifier. Linear modulation schemes require linear amplification of the modulated signal in order to minimize undesired out-of-band emissions from spectral re-growth. However, the active devices used within a typical RF amplifying device are inherently non-linear by nature. Only when a small portion of the consumed DC power is transformed into RF power, can the transfer function of the amplifying device typically be approximated by a straight line, i.e. as in an ideal linear amplifier case. This 'linear' mode of operation provides a low efficiency of DC to RF power conversion, which is unacceptable for portable (subscriber) wireless communication units. Furthermore, such low efficiency performance is also recognised as being problematic for the base stations.

Furthermore, the emphasis in portable (subscriber) equipment is to increase battery life. To achieve both linearity and efficiency, so called linearization techniques are used to improve the linearity of the more efficient amplifier classes, for example class 'AB', 'B' or 'C' amplifiers. A number and variety of linearizing techniques exist, which are often used in designing linear transmitters, such as Cartesian Feedback, Feed-forward, and Adaptive Pre-distortion.

In order to increase the bit rate used in transmit uplink communication channels i.e. communication channels from the subscriber communication unit to a serving base station, larger constellation modulation schemes, with an amplitude modulation (AM) component are being investigated and, indeed, becoming required. These modulation schemes, such as sixteen-point quadrature amplitude modulation (16-QAM), require linear PAs and are associated with high 'crest' factors (i.e. a degree of fluctuation) of the modulation envelope waveform. This is in contrast to the previously often-used constant envelope modulation schemes and can result in significant reduction in power efficiency and linearity.

To help overcome such efficiency and linearity issues a number of solutions have been proposed. One technique used to overcome efficiency and linearity problems relates to modulating the PA supply voltage in order to match the envelope of the radio frequency waveform that is being transmitted by the RF PA. Proposed solutions that utilise envelope modulation include envelope elimination and restoration (EER), and envelope tracking (ET).

It is known that the use of PA supply RF envelope tracking may improve both PA efficiency and linearity for high peak-to-average power ratio (PAPR) high-power transmit conditions. FIG. 1 illustrates a graphical representation 100 of two alternative techniques; a first technique that provides a fixed voltage supply 105 to a PA, and a second technique whereby the PA supply voltage is modulated to track the RF envelope waveform 115. In the fixed supply case, excess PA supply voltage headroom 110 is used (and thereby potentially wasted), irrespective of the nature of the modulated RF waveform being amplified. However, for example in the PA supply voltage tracking of the RF modulated envelope case 115, excess PA supply voltage headroom can be reduced 120 by modulating the RF PA supply, thereby enabling the PA supply to accurately track the instant RF envelope.

Envelope tracking may also support a high-efficiency improvement potential for high PAPR conditions, which in turn may lead to less DC power being dissipated. As a consequence, heat is reduced and the PA may operate at a cooler temperature for the same output power. However, it is also known that for high bandwidth signals, accurate tracking of the RF envelope is difficult to achieve in practical implementations. Dependent upon the overall system architecture, the bandwidth of the supply modulator may be significantly (for example two to five times) greater than the signal (envelope) bandwidth in order to minimize the impact of the modulator group delay through time alignment, etc.

It is known that differential circuit implementations may provide advantages with respect to noise, immunity and headroom over single ended circuit implementations. FIG. 2 illustrates graphically 200 a simplified overview of a differential envelope/modulated tracking signal, whereby a differential envelope/modulated waveform 210, comprising a positive input (Vinp) 215 and a negative input (Vinn) 220, is superimposed on a fixed DC signal 225. As illustrated, the differential envelope/modulated tracking signal comprises a DC portion and an AC portion, whereby both portions are passed through any subsequent differential circuit element.

FIG. 3 illustrates a known simplified modulator circuit 300 used for envelope tracking. The simplified modulator circuit 300 comprises a differential to single ended conversion arrangement 305 having a differential input 310 with a negative envelope signal input (N) 315 and a positive envelope signal input (P) 320. The differential to single ended conversion arrangement 305 converts the differential input 310 to a single ended output that is input to a first linear, Class AB, amplifier stage 325. The amplified signal is then combined with the output of a second, e.g. Class D, power amplifier stage 335, which uses a current sense 330 to sense the zero crossing of the first stage 325 and, together with hysteresis, control the current from the class D stage 335. In this manner, both AC and DC signals are passed through the signal path.

However, the simplified modulator circuit 300 is not ideal in that the input signal corresponding to the envelope is strictly positive. Thus, the potential headroom benefits due to employing a differential input signal (i.e. both positive and negative portions of the signal) are not realized, even when employing additional circuit techniques to minimize DC offset and/or reduce noise. A further disadvantage in the simplified modulator circuit 300 is that the input AC envelope signal is not symmetrical around a mean value. Often, complex techniques such as de-troughing (or other signal mapping techniques) may then be required to increase the asymmetry of the modulator signal, thereby increasing the complexity of circuit 300.

Thus, a need exists for an improved circuit, for example an integrated circuit comprising a modulator for use with a differential interface for an envelope tracking signal, a wireless communication unit and a method therefor.

SUMMARY OF THE INVENTION

Accordingly, the invention seeks to mitigate, alleviate or eliminate one or more of the above mentioned disadvantages, either singly or in any combination. Aspects of the invention provide an integrated circuit comprising a modulator for use with differential interface for an envelope tracking signal and in particular a differential envelope signal with a DC component being removed, a wireless communication unit and a method therefor, as described in the appended claims.

According to a first embodiment of the present invention, a signal processing circuit is disclosed. The signal processing circuit may be part of an integrated circuit or a wireless communication unit. The signal processing circuit includes a first circuit, a digital-to-analog converter (DAC) and a second circuit. The first circuit is arranged to receive a digital input signal with a non-zero direct current (DC) component, and subtract at least a portion of the DC component of the received digital input signal from the received digital input signal. The DAC is operably coupled to the first circuit, and arranged to perform a digital-to-analog conversion upon an output of the first circuit. The second circuit is operably coupled to the DAC, and arranged to add a DC component to an analog output signal derived from an output of the DAC.

According to a second embodiment of the present invention, a signal processing method is disclosed. The signal processing method includes: receiving a digital input signal with a non-zero direct current (DC) component; subtracting at least a portion of the DC component of the received digital input signal from the received digital input signal; performing a digital-to-analog conversion upon an output of the subtracting step; and adding a DC component to an analog output signal derived from an output of the digital-to-analog conversion.

According to a third embodiment of the present invention, a signal processing circuit is disclosed. The signal processing circuit may be part of an integrated circuit or a wireless communication unit. The signal processing circuit includes a processing circuit and a current mode differential to single ended conversion module. The processing circuit is arranged to receive a digital input signal with a non-zero direct current (DC) component, perform a DC level adjustment on the received digital input signal, and generate a differential analog signal according to the adjusted digital input signal. The current mode differential to single ended conversion module has a current mode interface operably coupled to the processing circuit, wherein the current mode differential to single ended conversion module is arranged to convert an analog output signal derived from the differential analog signal into a single ended output signal.

According to a fourth embodiment of the present invention, a signal processing method is disclosed. The signal processing method includes: receiving a digital input signal with a non-zero direct current (DC) component, performing a DC level adjustment on the received digital input signal, and generating a differential analog signal according to the adjusted digital input signal; and receiving an analog output signal derived from the differential analog signal through a current mode interface, and performing a differential to single ended conversion upon the received analog output signal to generate a single ended output signal.

These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Like reference numerals have been included in the respective drawings to ease understanding.

DETAILED DESCRIPTION

Examples of the invention will be described in terms of one or more integrated circuits for use in a wireless communication unit, such as user equipment in third generation partnership project (3GPP™) parlance. However, it will be appreciated by a skilled artisan that the inventive concept herein described may be embodied in any type of integrated circuit, wireless communication unit or wireless transmitter that could benefit from improved linearity and efficiency using a differential circuit. In some examples of the invention, a circuit design for interfacing an Envelope Tracking amplifier (supply modulator) to the envelope extraction path (Envelope extraction and DAC) is described. The circuit design may compensate for the strictly positive envelope modulated signal produced by the envelope extraction path. One example of the described circuit design may remove a fixed DC component from the positive envelope modulated signal, thereby increasing signal headroom used by subsequent differential circuit elements/devices, such as the digital-to-analog converter (DAC). The example circuit design in FIG. 5 may further comprise a number of techniques that may be employed to re-introduce a fixed DC component into the differential envelope modulated signal.

Some examples of the invention describe how the DC and AC paths may be split to provide a more optimal configuration than supplying the full envelope over a single interface. Some examples also describe a specific implementation of the AC amplifier that is suited to a differential implementation and allows straightforward recombination with the DC component.

Figure 1:
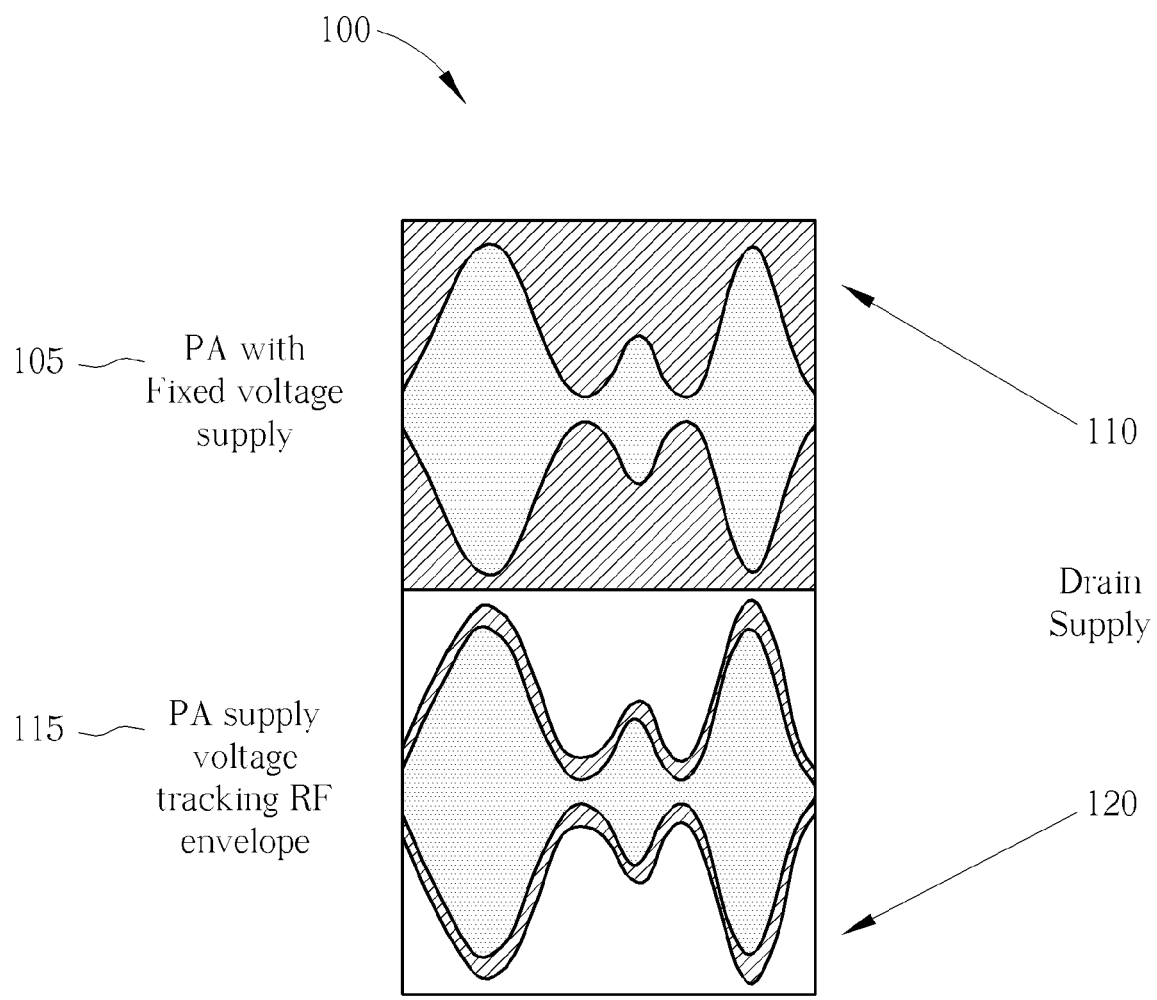
FIG. 1 illustrates a graphical representation whereby a PA supply voltage is modulated to track the RF envelope.
Figure 2:
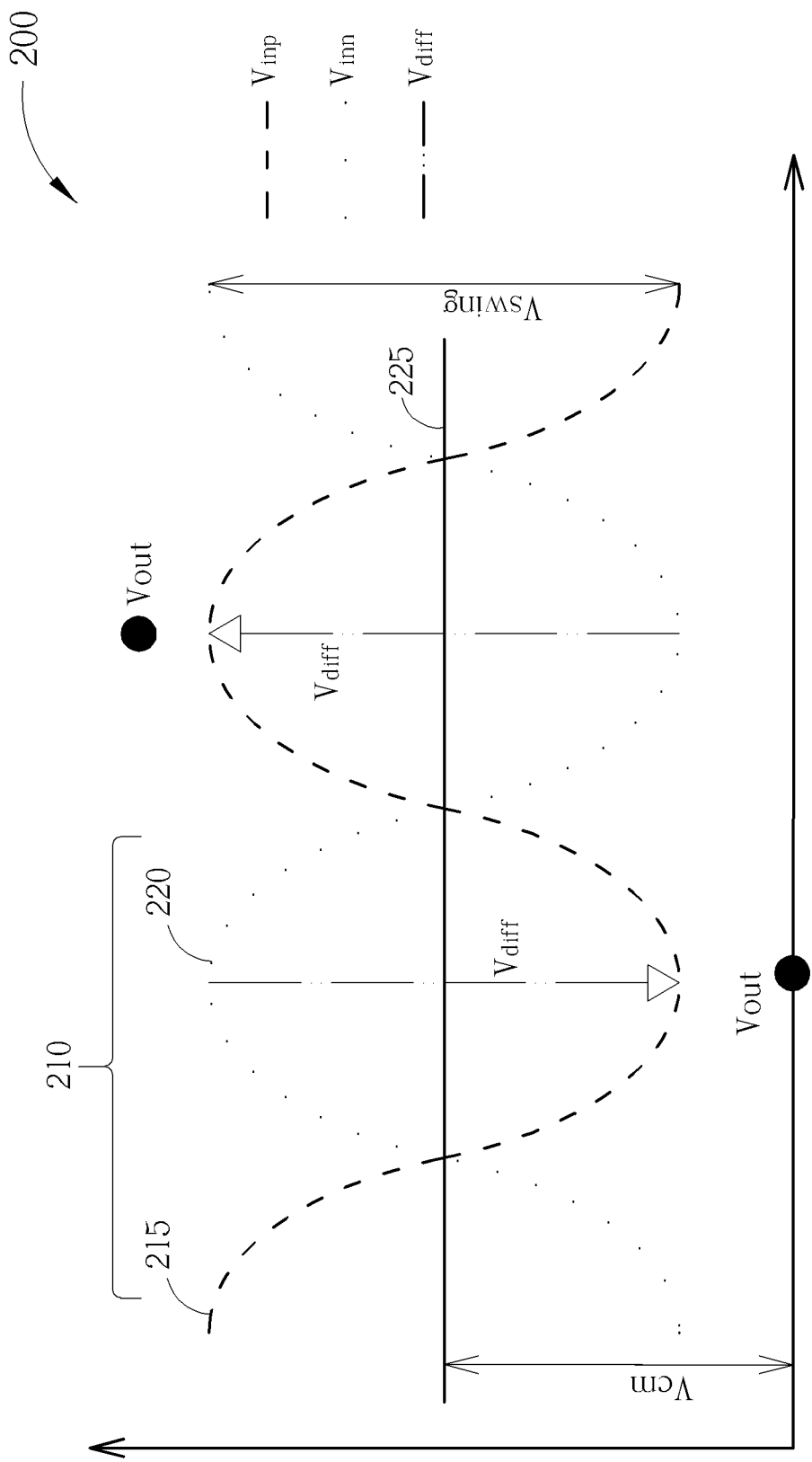
FIG. 2 illustrates graphically a known example of a differential signal having an AC component (portion) and a DC component (portion).
Figure 3:
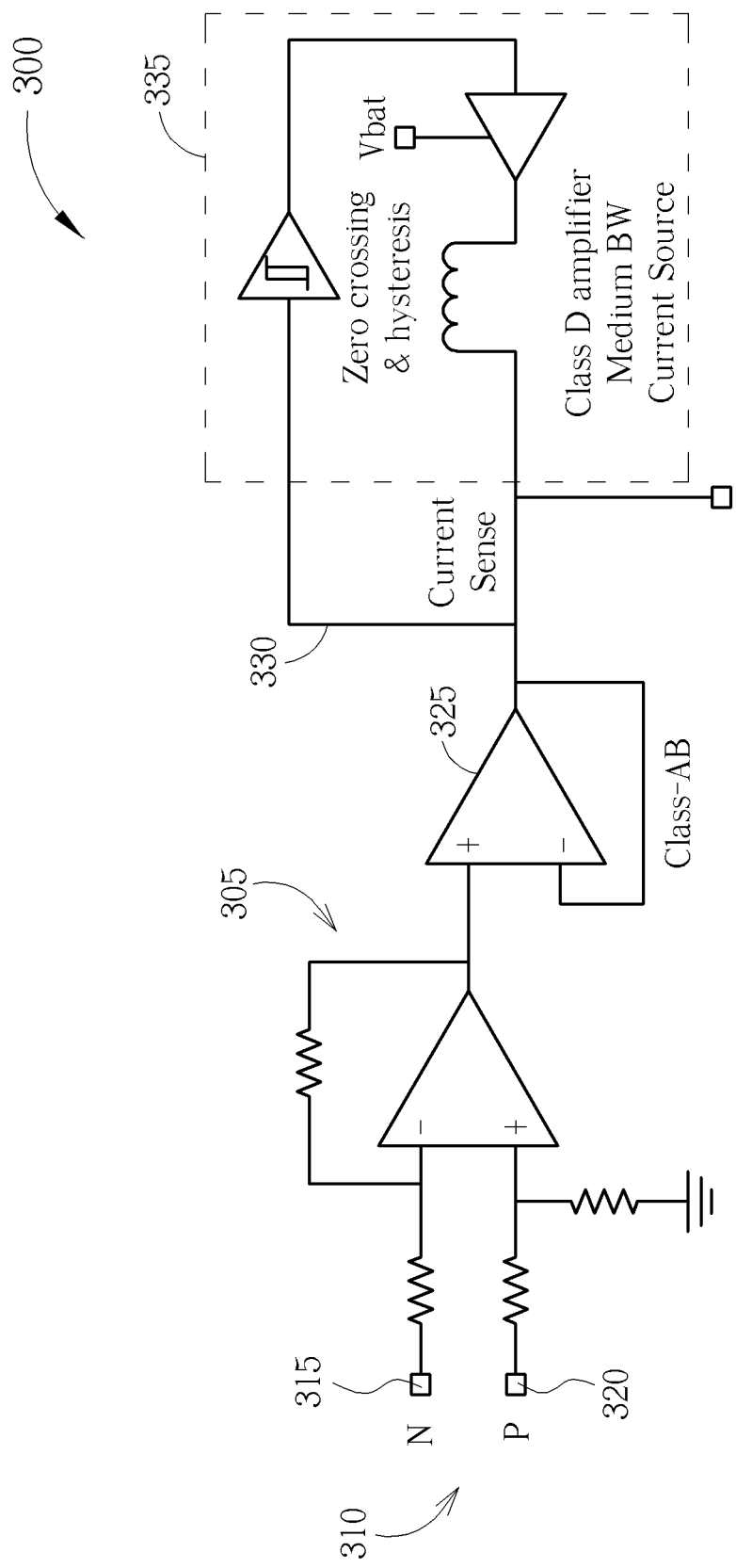
FIG. 3 illustrates a known modulator circuit design.

In one example embodiment, the inventors of the present invention have recognised and appreciated that the full range of the differential envelope signal of FIG. 2 resides wholly in the positive DC voltage region. Hence, if the differential modulated (envelope) waveform transitions between, say, +0.2 V and +1.0V (around a DC voltage), the differential circuitry that uses such a differential signal that corresponds to a signal range of +2V (i.e. −1V to +1V).

Furthermore, the inventors of the present invention have recognised and appreciated that the differential envelope signal of FIG. 2 is not symmetrical around its mean value. Hence, any potential headroom benefits gained in utilising differential signals (such as reduced offset requirements and improved noise performance) are lost, thereby negating the reasons to implement a differential circuit arrangement.

In some examples of the invention, a number of control mechanisms is/are provided in order to optimise the DC level of differential modulated (envelope) waveform. One example of the invention is described with reference to an integrated circuit for providing a differential interface for an envelope tracking signal. The integrated circuit comprises a subtraction module comprising a first input for receiving a digital envelope tracking signal and a second input for receiving a second signal, wherein the subtraction module is arranged to subtract the second signal from the digital envelope tracking signal and produce an envelope tracking signal with a reduced zero frequency component. A digital-to-analog converter (DAC) is arranged to receive the envelope tracking signal with the reduced zero frequency component and produce a differential analog version thereof. A modulator is operably coupled to a differential output of the DAC, wherein the modulator comprises a DC input point arranged to insert a DC component into the differential analog version of the envelope tracking signal. In one example, the above integrated circuit components may be implemented in a wireless communication unit.

Figure 4:
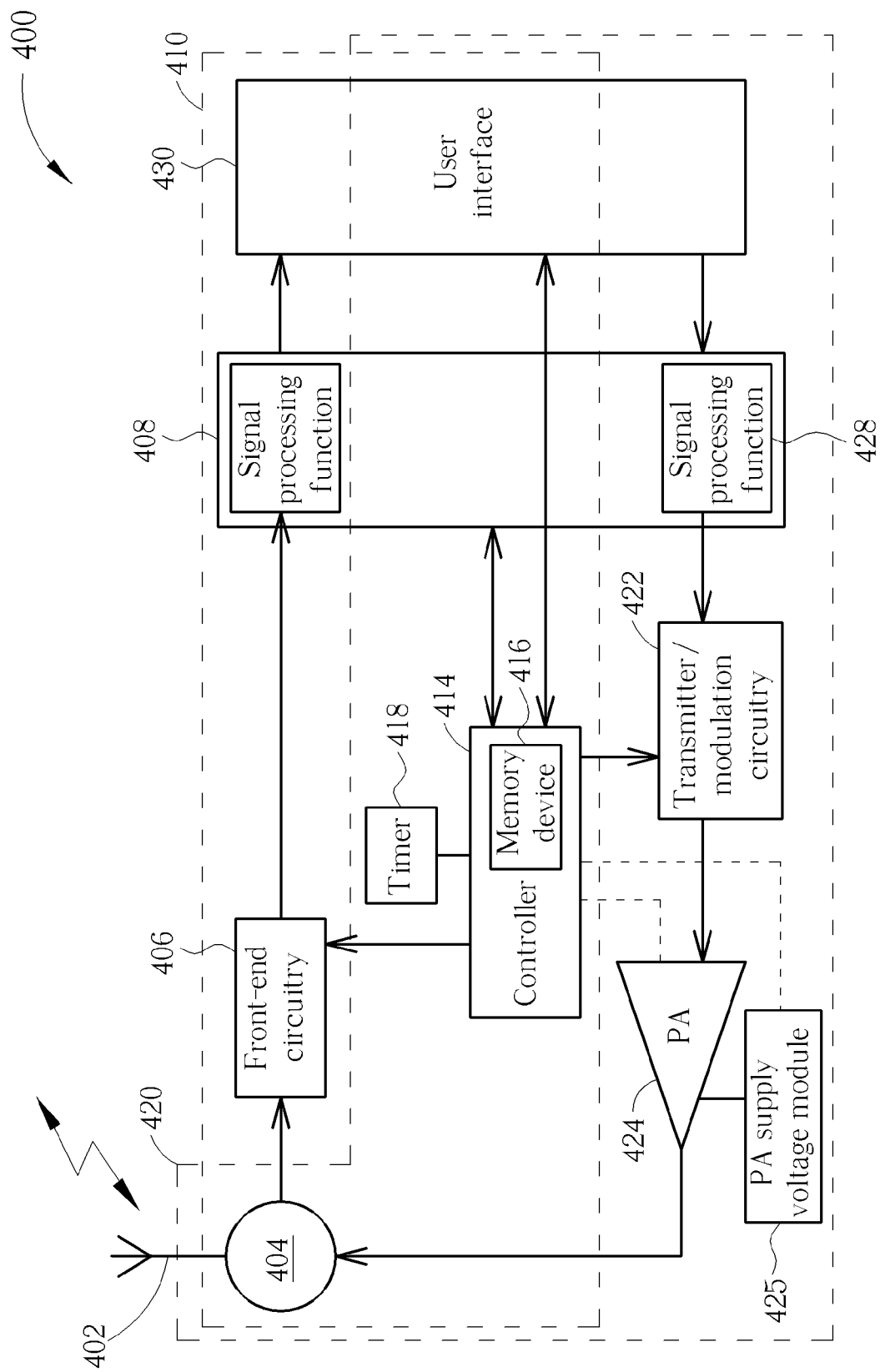
FIG. 4 illustrates an example block diagram of a wireless communication unit adapted to support envelope tracking.

Therefore, referring first to FIG. 4, a block diagram of a wireless communication unit (sometimes referred to as a mobile subscriber unit (MS) in the context of cellular communications or user equipment (UE) in terms of a 3$^{rd}$ generation partnership project (3GPP™) communication system) is shown, in accordance with one example embodiment of the invention. A skilled artisan will, however, readily appreciate that the concepts described herein are equally applicable to other wireless communication units, such as base transceiver stations or other infrastructure elements. A skilled artisan will also readily appreciate that the concepts described herein are equally applicable to any voice and/or data communication signal type.

The wireless communication unit 400 contains an antenna 402 preferably coupled to a duplex filter or antenna switch 404 that provides isolation between receive and transmit chains within the wireless communication unit 400. The receiver chain 410, as known in the art, includes receiver front-end circuitry 406 (effectively providing reception, filtering and intermediate or base-band frequency conversion). The front-end circuitry 406 is coupled to a signal processing function 408. An output from the signal processing function 408 is provided to a suitable user interface 430, which may encompass a screen or flat panel display. A controller 414 maintains overall subscriber unit control and is coupled to the receiver front-end circuitry 406 and the signal processing function 408 (generally realised by a digital signal processor (DSP)). The controller 414 is also coupled to a memory device 416 that selectively stores various operating regimes, such as decoding/encoding functions, synchronisation patterns, code sequences, and the like.

In accordance with examples of the invention, the memory device 416 may store modulation data, programming data for voltages and/or currents and DAC values, and power supply data for use in supply voltage control to track the envelope of the radio frequency waveform output by the wireless communication unit 400 and processed by signal processing function 408. Furthermore, a timer 418 is operably coupled to the controller 414 to control the timing of operations (transmission or reception of time-dependent signals and in a transmit sense the time domain variation of the PA (drain or collector) supply voltage within the wireless communication unit 400).

As regards the transmit chain 420, this essentially includes the user interface 430, which may encompass a keypad or touch screen, coupled in series via signal processing function 428 to transmitter/modulation circuitry 422. The transmitter/modulation circuitry 422 processes input signals for transmission and modulates and up-converts these signals to a radio frequency (RF) signal for amplifying in the power amplifier module or integrated circuit 424. RF signals amplified by the PA module or PA integrated circuit 424 are passed to the antenna 402. The transmitter/modulation circuitry 422, power amplifier 424 and PA supply voltage module 425 are each operationally responsive to the controller 414, with the PA supply voltage module 425 additionally responding to a reproduction of the envelope modulated waveform from the transmitter/modulation circuitry 422.

The signal processor function 428 in the transmit chain 420 may be implemented as distinct from the signal processor function 408 in the receive chain 410. Alternatively, a single processor may be used to implement processing of both transmit and receive signals, as shown in FIG. 4. Clearly, the various components within the wireless communication unit 400 can be realised in discrete or integrated component form, with an ultimate structure therefore being merely an application-specific or design selection.

Furthermore, in accordance with examples of the invention, the transmitter/modulation circuitry 422, together with power amplifier 424, PA supply voltage 425, memory device 416, timer function 418 and controller 414 have been adapted to support envelope tracking transmissions through generation of a suitable power supply to be applied to the PA 424. For example, a power supply is generated that is suitable for a wideband linear power amplifier, and configured to track the envelope waveform applied to the PA 424. In particular, the transmitter/modulation circuitry 422 comprises an IC, as further described with respect to FIG. 5, adapted to include a subtraction module comprising a first input for receiving a digital envelope tracking signal and a second input for receiving a second signal, wherein the subtraction module is arranged to subtract the second signal from the digital envelope tracking signal and produce an envelope tracking signal with a reduced DC (zero frequency) component. A DAC is arranged to receive the envelope tracking signal with the reduced DC component and produce a differential analog version thereof. A modulator is operably coupled to a differential output of the DAC, wherein the modulator comprises a DC input point arranged to insert a DC component into the differential analog version of the envelope tracking signal.

Figure 5:
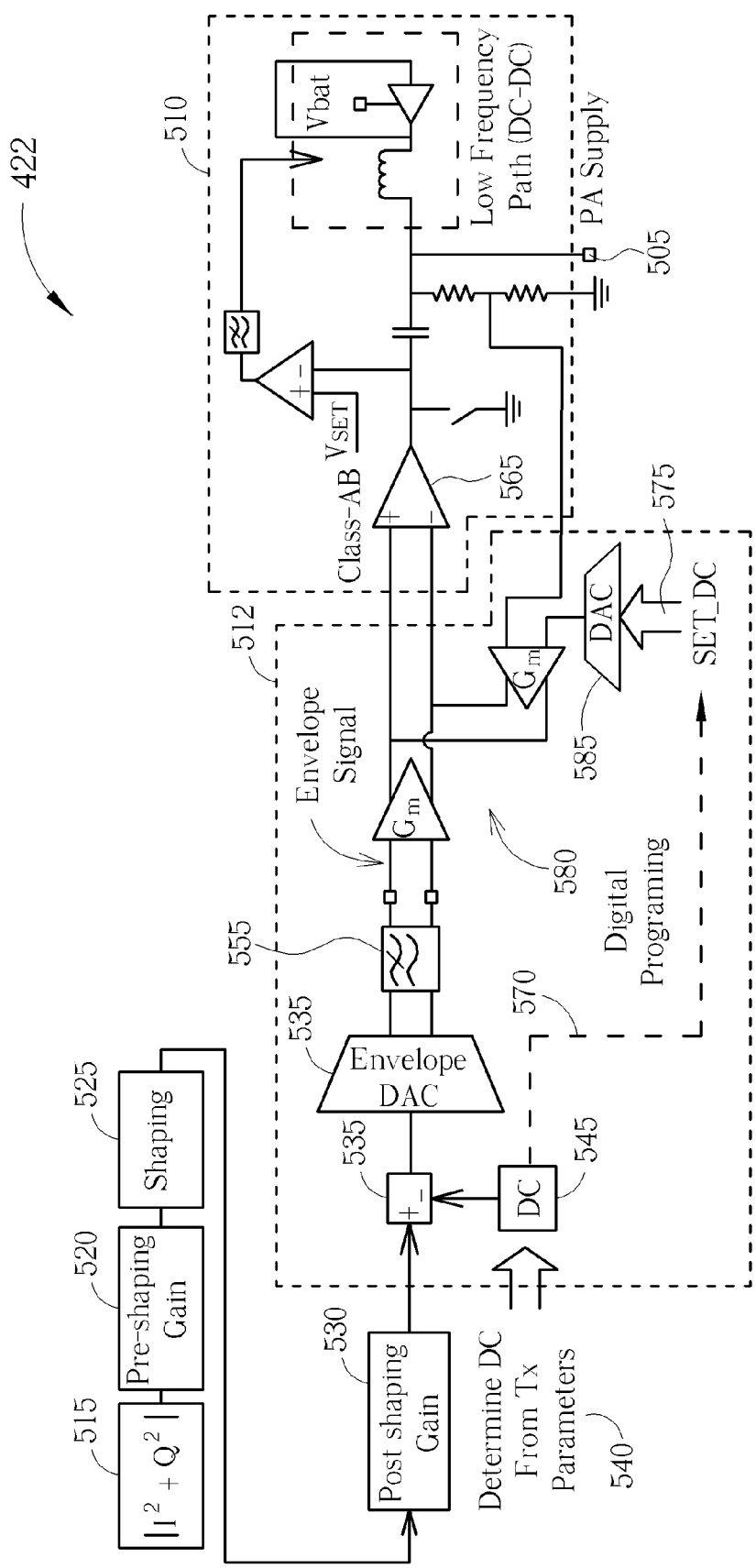
FIG. 5 illustrates one example block diagram of a part of a modulator circuit of a transmitter chain of a wireless communication unit adapted to support a differential interface for an envelope tracking signal.

In FIG. 5, one example block diagram of a part of a transmitter/modulation circuit/integrated circuit is illustrated, for example as applied to the transmitter/modulation circuit 422 of the wireless communication unit of FIG. 4. The transmitter/modulation circuit 422 in FIG. 5 has been configured and/or adapted to support envelope tracking. A power amplifier (PA) (not shown) receives an envelope modulated RF signal (not shown) as an input RF signal to be amplified. The PA also receives a power supply 505, say a wideband power supply from a power supply integrated circuit 510, as illustrated. For ease of understanding, and not to obfuscate or detract from the description of FIG. 5, electronic components, and in particular the power supply integrated circuit 510, will not be explained in any greater extent than that considered necessary. In other examples, the power supply may also, and advantageously, be configured to provide supply envelopes corresponding to different modulation formats.

The example block diagram of a part of a transmitter/modulation circuit/integrated circuit comprises signal magnitude determining circuit or component or logic (denoted by "$|I^2+Q^2|$") 515 followed by a pre-shaping gain function 520 arranged to provide gain to the input signal prior to the input signal being shaped by shaping logic 525. The shaped signal output by shaping logic 525 is input to a post-shaping gain circuit 530, in order to apply gain to the shaped input signal.

The amplified, shaped input signal is then input to an envelope conditioning logic circuit/integrated circuit 512. The envelope conditioning logic circuit/integrated circuit 512 comprises subtractor logic 535, where a DC signal 545 is subtracted from the amplified, shaped input signal provided to the subtractor logic 535, which may be implemented in any known manner, such as via a routine arithmetic operation that may be synthesised by digital elements/components. In this manner, the DC component from the amplified, shaped input signal is removed, thereby maximizing a range of a subsequently generated differential signal. The level of the DC signal 545 applied to the subtractor logic 535 may be determined from transmit parameters 540. For example, whilst a DC level, such as the mean, may be directly calculated from the data for a particular frame, this may not be practical or convenient. Alternatively, in such a practical scenario, a value based on the power level or a value related to the full scale level, e.g. half the positive full scale, may be used in other examples. The output from the subtractor logic 535 is input to an envelope digital to analog converter (DAC) 550. The envelope DAC 550 converts the single-ended digital input signal (from the subtractor logic 535) into a differential analog signal that is applied to reconstruction filter 555 to produce an envelope signal. Employing a differential envelope DAC 550, as illustrated, offers a number of advantages including better common mode rejection and improved signal-to-noise ratio (SNR) through increased signal headroom. The envelope signal is then applied to a current mode differential to single-ended converter circuit 580.

The current mode differential to single-ended converter circuit 580 comprises a linear Class AB amplifier 565 comprising a differential input and a single ended output providing the PA supply 505 to a load. In some examples, the current mode differential to single-ended converter circuit 580 may offer one or more of the following desirable features for use in an envelope tracking (ET) amplifier arrangement: (i) non-inverting feedback configuration that has benefits for noise and bandwidth; (ii) high impedance interfaces (both signal path and DC path); (iii) a lower noise gain; and (iv) a wider bandwidth.

The current mode differential to single-ended converter circuit 580 receives feedback from the output of the linear Class AB amplifier 565, with control being provided by a DAC 585 whose analog output is set 575 by digital programming 570 a digital level of the DC signal 545 applied to the subtractor logic 535.

Thus, and advantageously, a differential ET amplifier configuration is provided using separate paths for the AC signal (for example via differential envelope DAC 550 and reconstruction filter 555) and a DC (control) signal path (for example by digital programming 570 a digital level of the DC signal 545 applied to the subtractor logic 535), where DC is extracted (removed) in the digital domain and recombined with the signal envelope in the analog domain.

In some examples, the architecture may subtract a fixed level in the analog domain and then re-introduce/add an analog DC signal, possibly based on the subtracted signal. In some examples, the value to be added may be conveyed either as a digital signal, via a DAC, or an analog signal. This analog signal could be a distinct signal, single ended or differential, or part of a composite signal such as the common mode level of the differential envelope signal. Again, in some examples, the DC level being removed may be a fraction of the full scale possible for removal.

A secondary benefit that may be provided by examples of the invention is a use of a differential to single ended current mode topology with an additional DC input port, say via DAC 585.

Thus, in examples of the invention, the analog signal path may be optimised purely for AC performance, with respect to gain, noise, offset, ET DAC requirements, etc., since a negligible DC component remains after removal and therefore the DC component does not need to be handled.

In examples of aspects of the digital domain of the architecture of FIG. 5, the signal gain may be considered as scaling of those digital signals. Furthermore, 'shaping' of digital signals may be considered as encompassing any signal or waveform manipulation, such as clipping hard or soft, de-troughing hard or soft or any form of linear or non-linear mapping (e.g. pre-distortion) in order to correct for non-idealities in the PA. Various digital implementations may also be employed, for example use of a Look Up Table (LUT) that may be hard coded (ROM) or programmable (RAM) or adaptive such that it is capable of accepting user defined parameters.

Furthermore, in this manner, the envelope conditioning logic circuit/integrated circuit 512 may be arranged to, for example:
  (i) reduce the peak-to-peak voltage of the envelope signal, thereby improving efficiency,
  (ii) restrict the signal bandwidth of the envelope signal,
  (iii) perform any necessary gain and offset alignment of the envelope signal; and
  (iv) implement any signal formatting, which in the illustrated example includes converting between differential and single ended representation.

Figure 6:
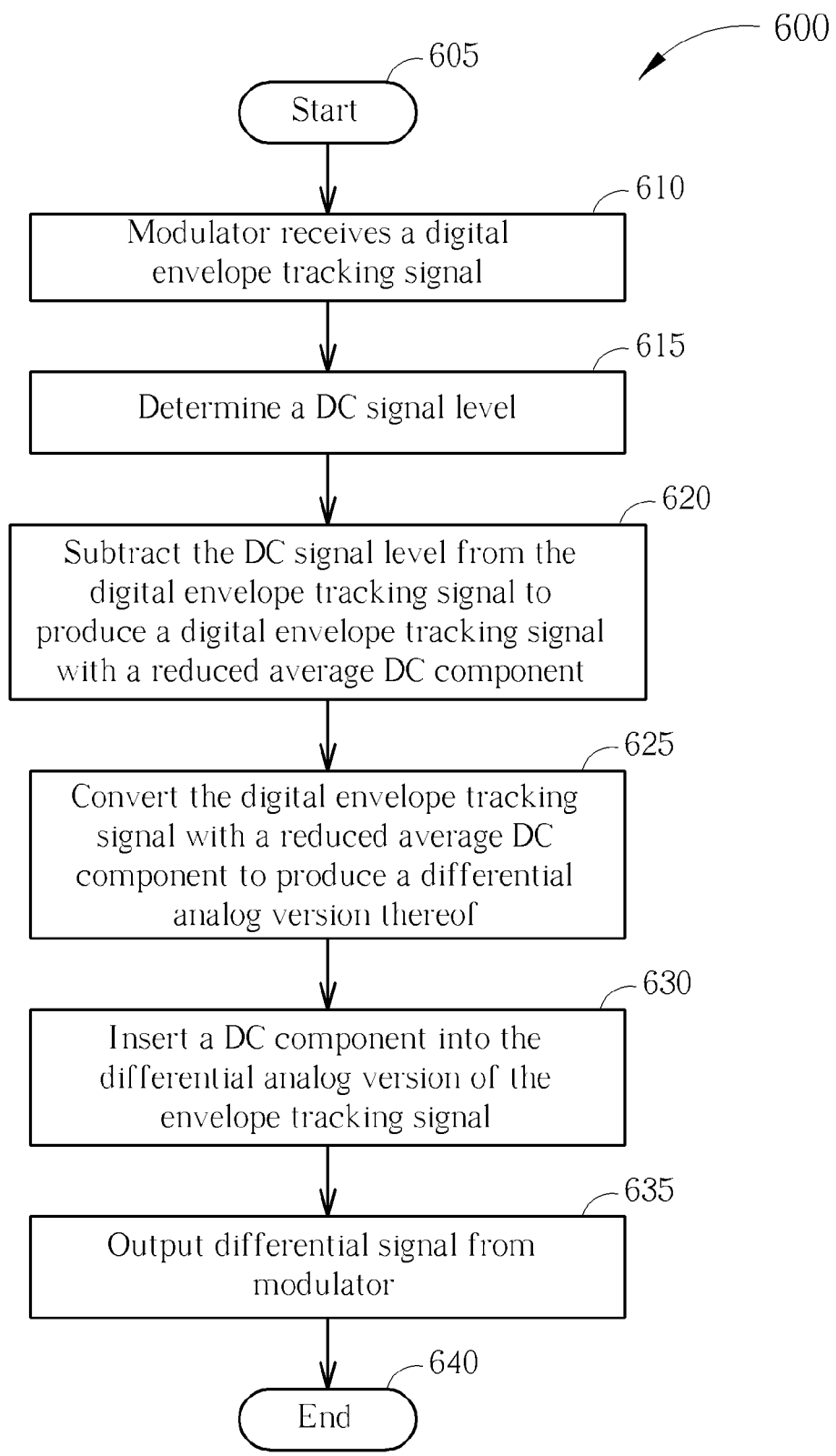
FIG. 6 illustrates one example flowchart of n operation of a modulator circuit of a wireless communication unit to support a differential interface for an envelope tracking signal.

FIG. 6 illustrates one example flowchart 600 of an operation of a modulator circuit of a wireless communication unit to support a differential interface for an envelope tracking signal. The flowchart 600 starts in 605 and comprises the modulator receiving a digital envelope tracking signal in 610 and determining a DC component associated with the received digital envelope tracking signal, in 615, for example a DC level within the digital envelope tracking signal or a typical or usual or anticipated DC level for subsequent subtraction from the digital envelope tracking signal. The flowchart 600 further comprises subtracting in 620 a second signal from the digital envelope tracking signal to produce an envelope tracking signal with a reduced average direct current (DC) component; and digital-to-analog converting in 625 the envelope tracking signal with the reduced average DC component to produce a differential analog version thereof. The method further comprises inserting a DC component into the differential analog version of the envelope tracking signal in 630 and outputting a differential signal from the modulator in 635. The flowchart ends at 640.

Thus, the hereinbefore examples provide an improved integrated circuit and a wireless communication unit providing a differential to single ended conversion of signals that may be employed in linear and efficient transmitter architectures, and in particular a wideband ET architecture.

Advantageously, some of the example embodiments of the invention, for example in response to splitting the AC and DC signal paths, may also facilitate benefiting from a differential path, maximising signal range headroom through a DAC, providing noise and offset improvement.

In some example embodiments, the DC component may be removed digitally and then recombined (e.g. added) to the AC (analog) envelope signal, say using a secondary low frequency (and possibly low resolution/precision) DAC, as described in FIG. 5.

Advantageously, some example embodiments of the invention may provide an ability to adapt the ET mode of operation, dependent upon the prevailing operational conditions. In particular, an ability to reconfigure DC signal levels of an ET signal, at least for a period of time, for example based on a power level in a particular time frame. In addition to changing the DC level subtracted and added to the signal, the gain of the differential signal may be varied to utilise the available headroom offered by the differential interface.

In some example embodiments, the DC component may be updated/recombined (e.g. added) to the AC envelope signal on any suitable time base e.g. per time slot for a slotted system e.g. WCDMA, LTE. In some examples, any DC offset introduced may be independently controlled e.g. via a digital serial interface, when the ET path and ET modulator are located separately.

In some example embodiments, the DC component subtracted from the digital envelope signal may be only a partial amount of the DC level in the digital envelope signal. In this manner, when for example a majority (but not all) of the DC component is subtracted and a residual DC is passed through the primary (AC) signal path since this remains DC coupled. In this example, it may be possible to reduce a signal resolution required in the DC signal path. This example may also be used for DC offset correction, e.g. via calibration, where the difference in the two DC components represents the correction signals required to compensate for the DC offset in the envelope tracking system.

In particular, it is envisaged that the aforementioned inventive concept can be applied by a semiconductor manufacturer to any integrated circuit comprising a PA employing a single ended supply. It is further envisaged that, for example, a semiconductor manufacturer may employ the inventive concept in a design of a stand-alone device, such as a power supply module, or application-specific integrated circuit (ASIC) and/or any other sub-system element. Alternatively, the examples of the invention may be embodied in discrete circuits or combination of components.

It will be appreciated that, for clarity purposes, the above description has described embodiments of the invention with reference to different functional units and processors. However, it will be apparent that any suitable distribution of functionality between different functional units or processors, for example with respect to the power supply circuitry or signal conditioning circuits or amplifier circuits may be used without detracting from the invention. For example, functionality illustrated to be performed by separate processors or controllers may be performed by the same processor or controller. Hence, references to specific functional units are only to be seen as references to suitable means for providing the described functionality, rather than indicative of a strict logical or physical structure or organization.

Aspects of the invention may be implemented in any suitable form including hardware, software, firmware or any combination of these. The invention may optionally be implemented, at least partly, as computer software running on one or more data processors and/or digital signal processors or configurable module components such as field programmable gate array (FPGA) devices. Thus, the elements and components of an embodiment of the invention may be physically, functionally and logically implemented in any suitable way. Indeed, the functionality may be implemented in a single unit, in a plurality of units or as part of other functional units.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individually listed, a plurality of means, elements or method steps may be implemented by, for example, a single unit or processor. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to 'a', 'an', 'first', 'second', etc. do not preclude a plurality.

Thus, an improved circuit, for example an integrated circuit comprising a modulator for use with a differential interface for an envelope tracking signal, a wireless communication unit and a method therefor, e.g. a method for power amplifier supply voltage control that use linear and efficient transmitter architectures, and in particular a wideband power supply architecture that can provide a supply voltage in power efficient manner therefor, have been described, wherein the aforementioned disadvantages with prior art arrangements have been substantially alleviated.

What is claimed is:

1. A signal processing circuit, comprising:
   a first circuit, arranged to receive a digital input signal with a non-zero direct current (DC) component, and subtract at least a portion of the DC component of the received digital input signal from the received digital input signal;
   a digital-to-analog converter (DAC), operably coupled to the first circuit and arranged to perform a digital-to-analog conversion upon an output of the first circuit; and
   a second circuit, operably coupled to the DAC and arranged to add a DC component to an analog output signal derived from an output of the DAC.

2. The signal processing circuit of claim 1, wherein the digital input signal is a digital envelope tracking signal, and the analog output signal is an analog envelope tracking signal.

3. The signal processing circuit of claim 1, wherein at least the portion of the DC component is a fixed level subtracted from the received digital input signal.

4. The signal processing circuit of claim 1, wherein the DC component is a fixed level added to the analog output signal.

5. The signal processing circuit of claim 1, wherein at least the portion of the DC component subtracted from the received digital input signal substantially equals the DC component added to the analog output signal.

6. The signal processing circuit of claim 1, wherein the output of the first circuit is a single-ended digital signal fed into the DAC, and the output of the DAC is a differential analog signal.

7. The signal processing circuit of claim 6, wherein the second circuit comprises a differential to single ended conversion module; and the differential to single ended conversion module adds the DC component to the analog output signal whilst converting the analog output signal into a single ended output signal.

8. The signal processing circuit of claim 7, wherein the differential to single ended conversion module is a current mode differential to single ended conversion module.

9. The signal processing circuit of claim 1, further comprising:
a secondary DAC, arranged to generate an analog output which controls the DC component added to the analog output signal.

10. The signal processing circuit of claim 1, further comprising:
a processor operably coupled to at least one of:
the second circuit and arranged to dynamically adapt at least one signal characteristic of the DC component to be added to the analog output signal; and
the first circuit and arranged to dynamically adapt at least one signal characteristic of at least the portion of the DC component to be subtracted from the received digital input signal.

11. The signal processing circuit of claim 10, wherein the dynamically adapted signal characteristic is at least one of: the DC component to be added to the analog output signal and at least the portion of the DC component to be subtracted from the received digital input signal, is a DC offset to be applied to an envelope tracking signal.

12. The signal processing circuit of claim 10, wherein the processor is arranged to dynamically adapt the at least one signal characteristic of the DC component to be added to the analog output signal over a period of time.

13. The signal processing circuit of claim 12, wherein the processor is arranged to dynamically adapt the at least one signal characteristic of the DC component to be added to the analog output signal on a transmit slot-by-transmit slot basis.

14. The signal processing circuit of claim 1, wherein the signal processing circuit is part of an integrated circuit or a wireless communication unit.

15. A signal processing method, comprising:
receiving a digital input signal with a non-zero direct current (DC) component;
subtracting at least a portion of the DC component of the received digital input signal from the received digital input signal;
performing a digital-to-analog conversion upon an output of the subtracting step; and
adding a DC component to an analog output signal derived from an output of the digital-to-analog conversion.

16. A signal processing circuit, comprising:
a processing circuit, arranged to receive a digital input signal with a non-zero direct current (DC) component, perform a DC level adjustment on the received digital input signal, and generate a differential analog signal according to the adjusted digital input signal; and
a current mode differential to single ended conversion module, having a current mode interface operably coupled to the processing circuit, wherein the current mode differential to single ended conversion module is arranged to convert an analog output signal derived from the differential analog signal into a single ended output signal.

17. The signal processing circuit of claim 16, wherein the current mode interface has a DC input point arranged to add a DC component to the analog output signal whilst the current mode differential to single ended conversion module converts the analog output signal into the single ended output signal.

18. The signal processing circuit of claim 17, wherein the processing circuit comprises:
a subtraction module, arranged to receive the digital input signal, and subtract at least a portion of the DC component of the received digital input signal from the received digital input signal to generate the adjusted digital input signal; and
a digital-to-analog converter (DAC), operably coupled to the subtraction module and arranged to perform a digital-to-analog conversion upon the adjusted digital input signal to generate the differential analog signal.

19. The signal processing circuit of claim 16, wherein the digital input signal is a digital envelope tracking signal, and the differential analog signal is an analog envelope tracking signal.

20. A signal processing method, comprising:
receiving a digital input signal with a non-zero direct current (DC) component;
performing a DC level adjustment on the received digital input signal, and generating a differential analog signal according to the adjusted digital input signal; and
receiving an analog output signal derived from the differential analog signal through a current mode interface, and performing a differential to single ended conversion upon the received analog output signal to generate a single ended output signal.

* * * * *